United States Patent [19]

Loce et al.

[11] Patent Number: 4,884,083

[45] Date of Patent: Nov. 28, 1989

[54] PRINTER COMPENSATED FOR VIBRATION-GENERATED SCAN LINE ERRORS

[75] Inventors: Robert P. Loce, Rochester; William L. Lama, Webster, both of N.Y.

[73] Assignee: Xerox Corporation, Stamford, Conn.

[21] Appl. No.: 252,618

[22] Filed: Oct. 3, 1988

[51] Int. Cl.$^4$ .................. G01D 15/14; G02B 27/42
[52] U.S. Cl. ................................ 346/108; 350/162.12
[58] Field of Search .................. 346/76 L, 108, 160; 350/162.12

[56] References Cited

U.S. PATENT DOCUMENTS

| | | |
|---|---|---|
| 3,867,571 | 2/1975 | Starkweather et al. . |
| 4,108,538 | 8/1978 | Felstead .................. 350/162.12 |
| 4,153,336 | 5/1979 | Minami et al. . |
| 4,305,650 | 12/1981 | Knox . |
| 4,389,659 | 6/1983 | Sprague . |
| 4,477,175 | 10/1984 | Snelling . |
| 4,647,154 | 3/1987 | Birnbach et al. . |
| 4,699,497 | 10/1987 | Hinton et al. . |

*Primary Examiner*—Clifford C. Shaw
*Assistant Examiner*—Mark Reinhart

[57] ABSTRACT

A printing system employing a raster output scanning device is compensated for the effects of motion of the medium upon which an image is being printed. An amplitude transmittance spatial filter is positioned either in an exit pupil of the "slow scan" optics of the system or in the first Fourier transform plane of a lens positioned between the scanning device and the recording medium. Several preferred transmittance functions are provided.

4 Claims, 4 Drawing Sheets

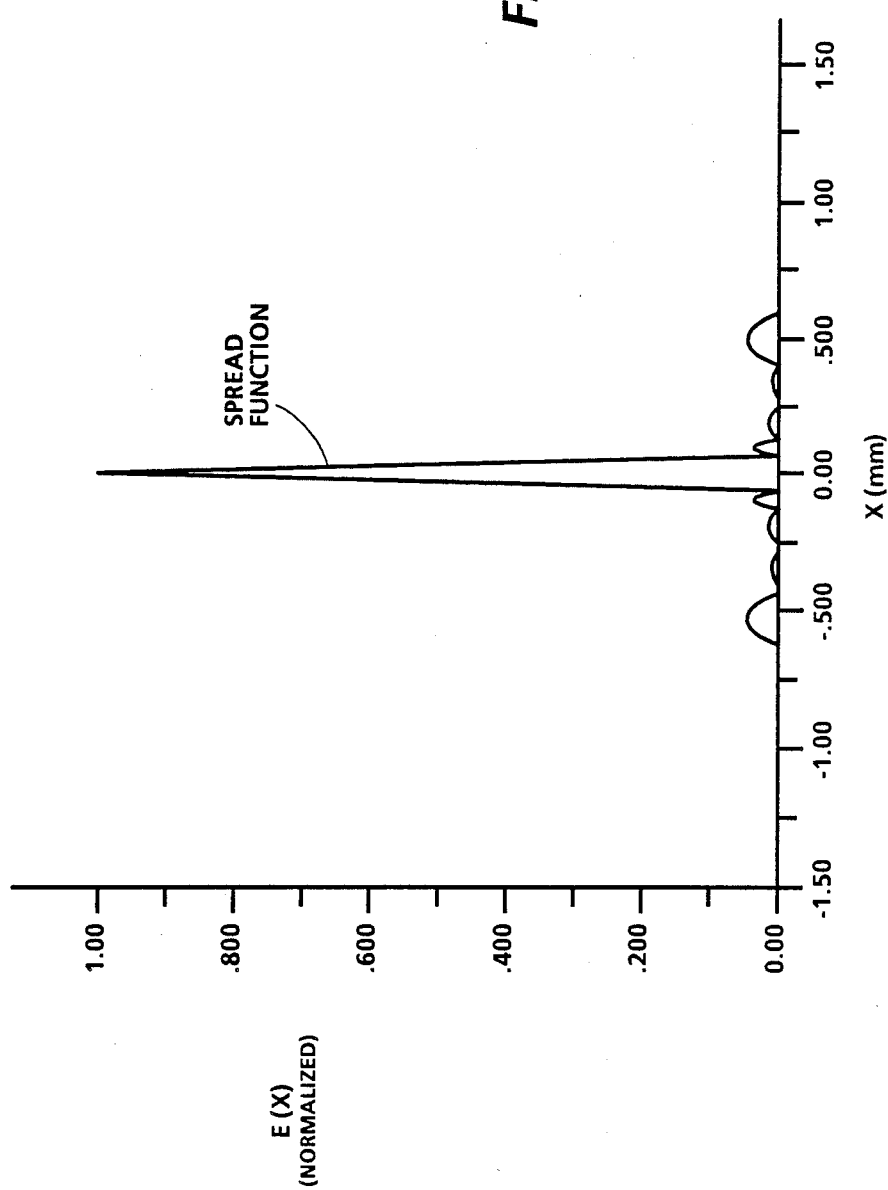

PRINTER COMPENSATED FOR VIBRATION-GENERATED SCAN LINE ERRORS

BACKGROUND AND INFORMATION DISCLOSURE STATEMENT

This invention relates to an electronic copier or printer of the type which uses a raster output scanner (ROS) to form images on a moving photoreceptor surface. More particularly, the invention is directed towards a spatial filter placed along the optical path for compensating for errors in imagined scan lines due to mechanical vibration present in the photoreceptor.

In document reproduction systems which incorporate scanning illumination systems (moving illumination sources, reflectors, projection lens) to project an image onto a moving photoreceptor, it is known that undesirable exposure strobing can result from mechanical vibrations of the various components comprising the optical system.

U.S. Pat. No. 4,699,497 describes a method and apparatus for compensating for the effects of vibration of a scanning illumination lamp as it accelerates through a scan cycle. The compensation for this system relies on increasing the natural frequency of the illumination lamp to nullify the effects of the lamp vibration.

Another common cause of strobing in prior art light lens systems is the non-uniform (vibrational) motion of the photoreceptor, whether of the drum or belt type. In copending application U.S. Ser. No. 910,708 assigned to the same assignee as the present invention, there is disclosed an optical transmission filter which is placed in the optical path. The filter has specified transmittance characteristics which result in reduction or elimination of the strobing.

Mechanical vibration of the photoreceptor is also a problem in non-light lens imaging systems. Examples of printers using image bars to print on the surface of a photoreceptor are found in U.S. Pat. No. 4,477,175, where the image bar is composed of a plurality of individually activated illumination elements (LEDs), and in U.S. Pat. No. 4,389,659 where the image bar is composed of a plurality of individually activated electro-optic electrodes. An example of a system using a raster output scan (ROS) optical system is disclosed in U.S. Pat. No. 3,867,571. In this patent, a laser beam is modulated in accordance with an image data input and an image reflected from a rotating polygon to form a scan line at a photoreceptor surface. For this type of printing system, photoreceptor vibration can cause periodic modulation in the gray regions, a phenomenon known as banding. Periodic exposure modulation in raster-generated images is the digital analog of exposure strobing caused by mechanical vibrations in light-lens scanning-type copiers. Resultant output copies are subject to solid area exposure non-uniformity banding in half tones and variations in line width.

The present invention is directed towards a system for compensating for periodic exposure modulation in images transmitted by a raster output scan device to the surface of a photoreceptor, the photoreceptor being subject to mechanical vibration. More specifically, the invention is directed towards a laser printing system comprising means for generating a beam of high intensity light, a moving recording medium sensitive to said high intensity light, optical means comprising a plurality of optical elements interposed between said light generating means and said recording medium, and including a cylindrical lens positioned in proximity to said recording media for imaging said beam to a spot at the surface of said medium, modulating means located between said light generating means and a scanner device for modulating the light beam in accordance with the information content of electrical signals, means coupled to said modulating means for deflecting said modulated light beam to a predetermined position on said scanner, said scanner device comprising a multi-faceted polygon located in the path of said modulated beam between said beam generating means and said recording medium and having reflective facets for reflecting the beam incident thereon onto said medium, means for rotating said polygon such that the reflected light is scanned in successive traces in any direction across said medium, said system further including an amplitude transmittance spatial filter positioned in the first Fourier plane of said cylindrical lens.

The following references contain disclosures which appear to be material to the present invention.

U.S. Pat. No. 4,305,650 to Knox discloses an illumination system which uses a transmittance filter for eliminating strobing. The transmittance filter overlays a plate defining an aperture between that filter and a photoconductive member.

U.S. Pat. No. 4,153,336 to Minami et al discloses an apparatus for detecting defects of a pattern using a spatial filter located on the Fourier transform plane of a Fourier transformed informtion light.

U.S. Pat. No. 4,647,154 to Birnback et al discloses an optical image processor based on geometric and diffraction optical systems for feature enhancement, wherein Fourier processing and spatial filtering is employed.

A copending application U.S. Ser. No. 139,391 assigned to the same assignee as the present invention discloses a method to compensate for effects of photoconductor vibration in a printing system utilizing an image write bar. Photoconductor vibration is detected and electrical signals are generated which are used to adjust the on/off timing of the write bar operation and the intensity of the image bar output. These adjustments result in compensation for the effects of photoconductor vibration.

BRIEF DESCRIPTION OF THE DRAWINGS

FIG. is a top perspective view of a printing system utilizing a compensating filter positioned in the first Fourier plane of a post polygon lens.

FIG. 5 is an exposure profile of a spatial filter incorporating four opaque bars.

DESCRIPTION OF THE INVENTION

Figure 1:
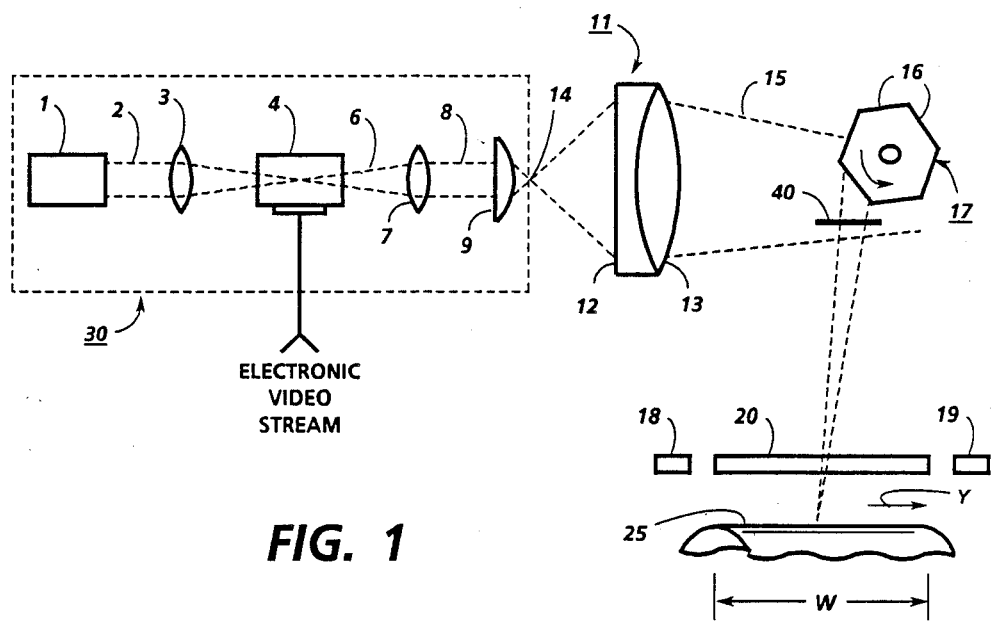

FIG. 1 illustrates a simplified representation of the optical and recording portions of a laser printing system in accordance with the present invention.

A light source 1 provides the original light beam for utilization by the printing system. The light source 1 is preferably a laser, such as helium-cadmium or helium-neon laser, which generates a collimated beam of monochromatic light 2. The monochromatic light beam is focused by spherical lens 3 onto modulator 4, the light beam 2 being modulted in conformance with the information contained in a video signal input.

Modulator 4 may be any suitable modulator or modulator/deflector for converting the video information to the form of a modulated light beam 6 at the output of the modulator 4. By means of the modulator 4, typically an acousto-optic modulator, the information within the video signal is represented by the modulated light beam 6.

The light beam 6 is incident on spherical lens element 7 which collimate the incident beam 6. The collimated light output beam 8 from lens 7 is then directed to cylindrical lens 9 which spreads the beam energy in the scan (or tangential) direction and directs the beam to imaging lens 11. Imaging lens 11, in the embodiment illustrated, is a doublet and comprises a biconcave lens element 12 comented to a convex lens element 13. Other lens arrangements may be utilized, the only requirement being that the imaging lens 11 is capable of forming an image of laser beam spot 14 on the surface of medium 25. Imaging lens 11 produces a beam 15 which impinges upon and illuminates a plurality of contiguous facets 16 of a scanning polygon 17 as shown.

In the preferred embodiment, the rotational axis of polygon 17 is orthogonal to the plane in which light beam 6 travels. The facets 16 of the polygon 17 are mirrored surfaces for the reflection of any illuminating light impringing upon them. With the rotation of the polygon 17, light beams are reflected from the illuminated facets and turned through a scan angle for flying spot scanning. Alternatively, flying spot scanning could be provided by any other suitable device, such as a holographic scanner incorporating linear diffraction gratings.

Medium 25 may be a xerographic drum (a portion of the surface is illustrated) which rotates consecutively through a charging station (not shown) comprising a corona discharge device, an exposure station where the beam from the rotating polygon 17, passing through cylindrical lens 20, would traverse a scan width W on the drum in the direction of arrow Y, a developing station, and a transfer station (not shown) where copy paper is passed in contact with the drum and receives an electrostatic discharge to induce a transfer of the developed image from the drum to the copy paper.

Usable images are provided in that the information content of the scanning spot is represented by the modulted or variant intensity of light respective to its position within the scan width W. As the spot traverses a charged surface, the spot dissipates the electrostatic charge in accordance with its light intensity. The electrostatic charge pattern thus produced would be developed in the developing station and then transferred to the final copy paper. The developed image may exhibit the aforementioned undesirable defects of solid area nonuniformity, line growth and halftone banding in the presence of mechanical vibration of the drum 25. These undesirable defects are reduced in a final embodiment of the invention by placing an amplitude transmittance filter 40 in the Fourier transform plane at or near one of the facets of polygon 17. This filter has the function of lowering the imaging system's frequency response at a vibrational spatial frequency $f_s$ and is designed pursuant to the following.

Figure 2:
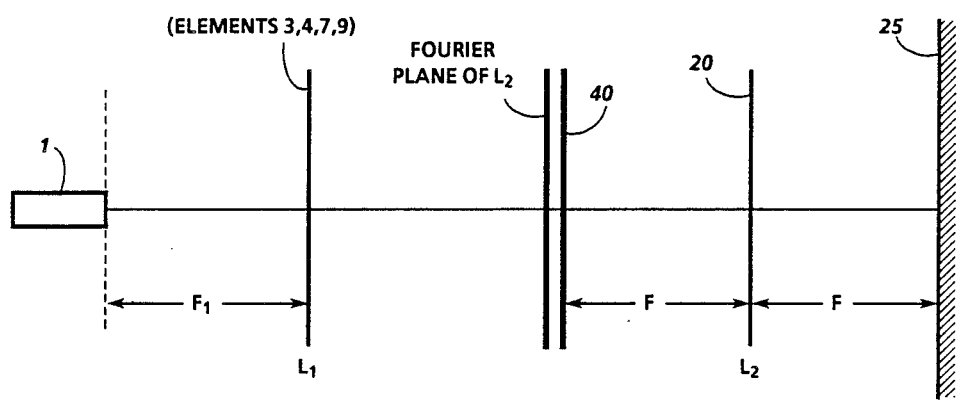
FIG. 2 is a schematic view of the FIG. 1 system simplified and unfolded.

Referring to FIG. 2, an optical electric field amplitude g(x) exists in the slow scan direction (x) incident on the surface of drum 25 while scanning a single raster line. It is a function of the electric field amplitude (h(x')) entering the Fourier transform plane of the post polygon optics, $L_2$. In some systems, this plane is near the polygon facet in use. Using the Transmission Function approach to electric field propagation, the electric field amplitude exiting the Fourier transform plane is a product of h(x') and T(x') where T(x') can be the amplitude reflectance of the polygon facet or the amplitude transmittance of filter 40 placed in or near the Fourier plane of $L_2$. Ignoring degradation caused by the post polygon optics (20) we can write the field amplitude at the surface of drum 25 as $$g(X) = K \int_{-\infty}^{\infty} h(X')T(X')\exp[-i2\pi XX'/\lambda F]dX' \quad (1)$$

where $\lambda$ is the wavelength of light, F is the focal length of the post polygon optics and K is a complex constant. Substituting $f' = x'/\lambda F$:

$$g(X) = K(\lambda F) \int_{-\infty}^{\infty} h(\lambda Ff')T(\lambda Ff')\exp[-i2\pi Xf']df' = \quad (2)$$

$$\widetilde{K}(\lambda F)^{-1} \widetilde{h}(X/\lambda F) * \widetilde{T}(X/\lambda F)$$

(where * = convolution) and where tilde (~) denotes a Fourier transformed function. The photoreceptor responds to intensity I which is proportional to $|g(x)g^*(x)|$. Thus, $$I(X) = c|g(X)g^*(X)| \quad (3)$$

where g* = the complex conjugate of g(x) and where c is a constant. The raster line exposure distribution $E_1(x)$ is obtained by integrating the intensity in the fast scan direction Y. The integration introduces another constant and yields $E_1(x) = c'[g(x)]^2$. This raster line exposure distribution $E_1(x)$ is replicated at positions on the photoconductor. For a constant photoconductor velocity and with no polygon wobble or pyramid error, the scan lines will be spaced at a constant separation $\Delta$ and the replication function $r_0(x)$ can be written.

$$r_0(X) = \frac{1}{\Delta} \text{comb}(X/\Delta) = \sum_{m=-\infty}^{\infty} \delta(X - m\Delta) \quad (4)$$

where $\delta$ is the Dirac delta function. If a single frequency of photoreceptor vibration or n frequencies are present, the replication functions are $$r_1(X) = \sum_{m=-\infty}^{\infty} \delta[X - m\Delta - \epsilon\sin(2\pi f_s m\Delta + \phi)] \quad (5)$$

and $$r_n(X) = \sum_{m=-\infty}^{\infty} \delta\left[X - m\Delta - \sum_{k=1}^{n} \epsilon_k \sin(2\pi f_{sk} m\Delta + \phi_k)\right] \quad (6)$$

where $f_{sk}$ is the spatial frequency of vibration and $\epsilon_k$ is the maximum raster spacing error caused by that vibration frequency. In general, the resulting exposure E(x) on the photoreceptor can be written.

$$E(X) = c'|g(X)g^*(X)| * r(X) \quad (7)$$

If vibrations are present in the system, there will be a modulation of the exposure at the vibration spatial frequencies. However, by choosing the proper functions for T(x') and h(x'), the exposure modulation can be reduced or eliminated. To achieve this end, the frequency spectrum of the exposure distribution must be lowered at $\pm f_{sk}$. Fourier transforming E(x) gives the frequency spectrum:

$$\tilde{E}(f_s) = c' \int_{-\infty}^{\infty} |g(X)g^*(X)| * r(X)\exp[-d2\pi X f_s]dX = \quad (8)$$

$$c'(\lambda F)^2|K|^2 \{[h(\lambda F f_s)T(\lambda F f_s)]*[h^*(\lambda F f_s)T^*(\lambda F f_s)]\} \cdot \tilde{r}(f)$$

The autoconvolution of the hT product is equivalent to the unnormalized MTF of the system. If this term is zero at $f_s = \pm f_{sk}$, the exposure modulation at that frequency will be eliminated.

Based on the foregoing analysis, transmittance filter 40 can be designed with a transmittance profile which, while not completely eliminating the nonuniformity due to the vibration, can alleviate it to a controlled degree without seriously degrading the resolution of the system. As a first example, a filter which consists of a transparent background with a plurality of spaced opaque lines running parallel to the fast scan direction can completely eliminate the banding at $f_s$. A functional description of this filter is $$T(X') = 1 - \sum_{n=-\infty}^{\infty} rect\left[\frac{X' - nF\lambda f_s}{F\lambda f_s}\right] - \quad (9)$$

$$\sum_{n=-\infty}^{\infty} rect\left[\frac{X' + nF\lambda f_s}{F\lambda f_s}\right]$$

Figure 3:
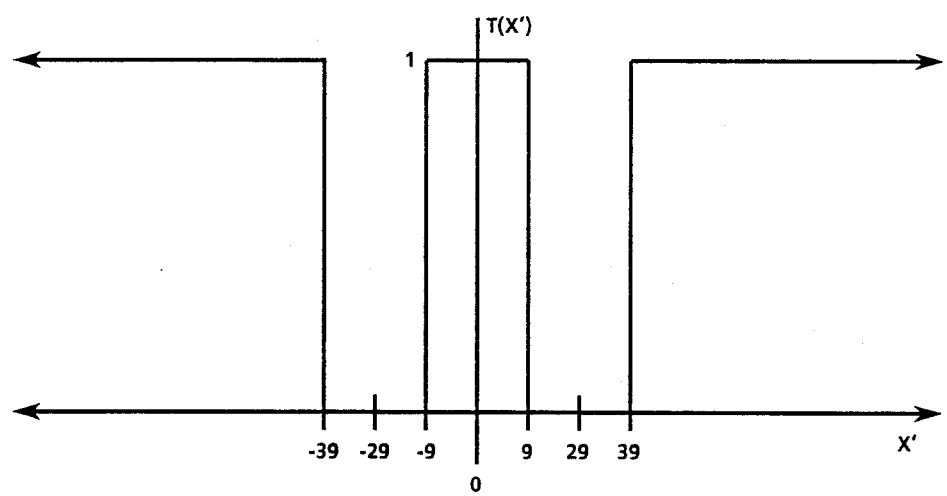
FIG. 3 illustrates the transmittance function of a spatial filter incorporating two opaque bars.

However, a problem with this filter is that frequencies other than $f_s$ are significantly attenuated also $(\tilde{E}(f_s(2n+1))=0)$. To minimize attenuation of other frequencies (and loss of resolution), filters with fewer bars can be used. A specific case was examined with $F=500$ mm, $\lambda = 0.6328 \times 10^{-3}$ mm, $h(x')=K \exp[-2\pi x'^2/(\lambda Fb)^2]$, $b=22.37$ and $f_s=1$ cy/mm. A filter having only 2 opaque bars given by equation (10) and shown in FIG. 3 resulted in 20 percent attenuation of the exposure banding at 1 cy/mm.

$$T_{2\,bar}(X') = 1 - rect\left(\frac{X' - F\lambda f_s}{F\lambda f_s}\right) - \quad (10)$$

$$rect\left(\frac{X' + F\lambda f_s}{F\lambda f_s}\right)$$

Figure 4:
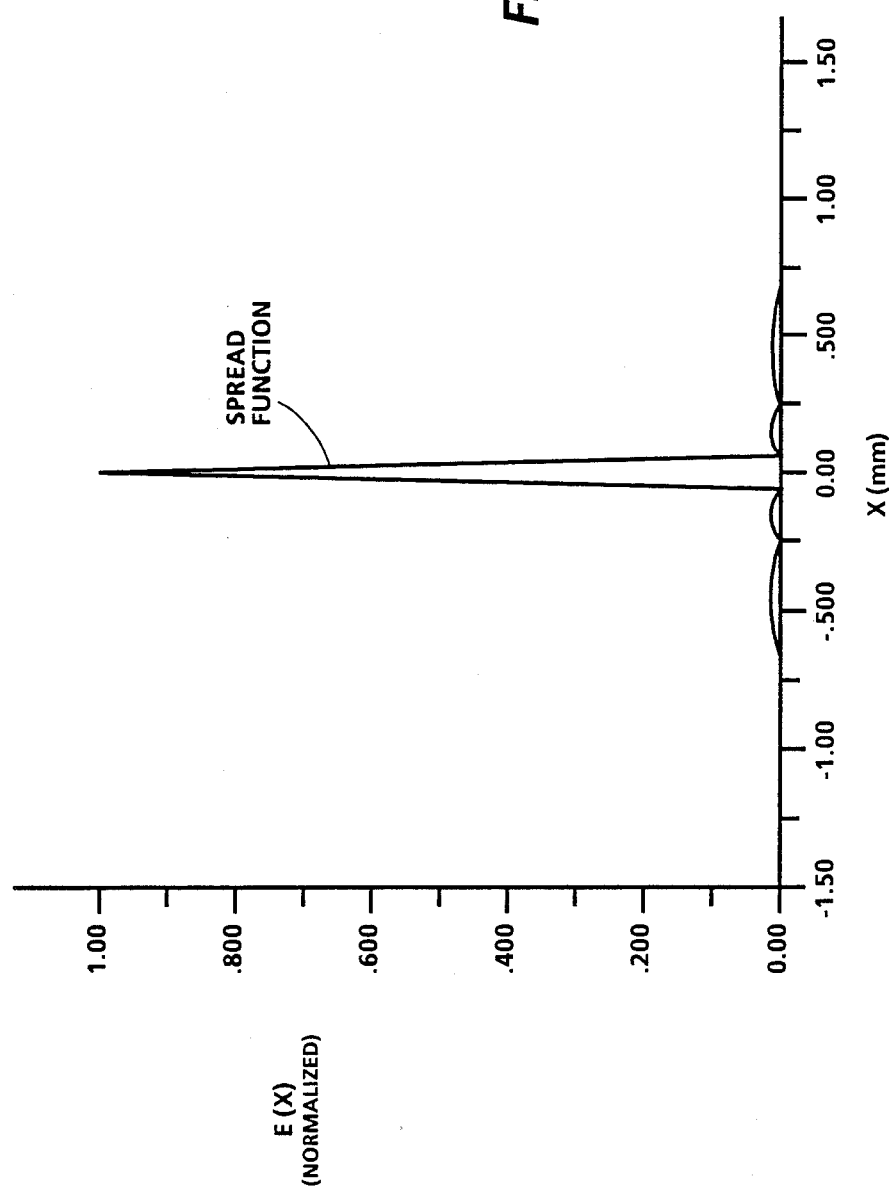
FIG. 4 is an exposure profile plot of the filter of FIG. 3.

The exposure profile in the x direction of the writing beam is given by Equation (11) and shown in FIG. 4.

$$E(X) = \quad (11)$$

$$K'\left[\exp\left[-\frac{\pi b^2 X^2}{2}\right] - \exp\left[-\frac{\pi b^2 X^2}{2}\right]*2\text{sinc}(X)\cos(2\pi X)\right]$$

It was found, by calculation, that a four-bar filter attenuated the exposure strobing by approximtely 48 percent without significantly degrading imaging resolution. The resulting single line exposure distribution is shown in FIG. 5. Note that as the number of bars in the filter is increased the attenuation factor increases, but so does the hieght of the sidebands in the single line exposure distribution (which reduces the unwanted modulation). As these sidebands grow in height, they may begin to degrade the image.

The class of filters that will perform the desired attenuation is not limited to opaque bars although they are preferred because of the simplicity of design and implementation. Filters which are more complex may result in more ideal exposure distributions. These types of filters may be holographic or dielectric, which can preferentially change the phase of the wavefront to effectively yield negative transmittance values. Continuously varying neutral density filters or a combination of all of the types described could also be used.

According to a second aspect of the invention, a spatial filter can also be designed for a more general laser ROS in which some set of optical elements forms a raster scanned image of an object pixel, O, which is continuously scanned in the fast scan direction (y), and replicated in the slow scan direction (x). In the slow scan direction, the object distribution O(x) is usually the gaussian laser beam profile at the exit plane of the modulator 4 (FIG. 1). As previously stated, r(x) may have nonuniform spacing due to the vibrations, which leads to print defects such as nonuniform solid areas, banding in halftones and line width variations.

The ROS optics contain a multiplicity of "exit pupil" planes where the "exit pupil" represents an aperture through which the (projected) cone of light must pass as it leaves the imaging elements and diffracts to form an image. In any plane the shape of the "exit pupil" may be determined by ray tracing. The coherent spread function of the optical system is the Fourier transform of the exit pupil, which may contain an amplitude transmittance function T(x'). In this aspect of the invention, the correction filter may be placed in any plane, while in the first aspect the filter was designed to work in the Fourier plane of the post polygon optics. Thus, the slow scan line spread function, l(x), is given by $$l(X) = K \int_{-\infty}^{\infty} T(X')\exp\left[-\frac{i2\pi XX'}{\lambda d_i}\right]dX' \quad (12)$$

$$= K\tilde{T}\left(\frac{-X}{\lambda d_i}\right) \quad (13)$$

where the constant K comes from integrating over the exit pupil in the fast scan direction, $d_i$ is the distance from the pupil (filter) plane to the image, and $\tilde{T}$ is the Fourier transform of the spatial filter in the pupil. If the object electric field amplitude is O(x), then the image amplitude is given by the convolution $$g(X) = \frac{1}{M} l(X) * \frac{1}{M} O\left(\frac{-X}{M}\right) \quad (14)$$

where M is the magnification and O(−x/M) is the magnified geometrical image of the object. The image exposure of one raster line is then given by $$E_1(X) = C\left[\frac{1}{M} l(X) * \frac{1}{M} O\left(\frac{-X}{M}\right)\right]. \quad (15)$$

-continued $$\left[ \frac{1}{M} I(X) * \frac{1}{M} O\left(\frac{-X}{M}\right) \right] *$$

where C is a constant inversely proportional to the scanning spot velocity. The image plane exposure, in background areas of the print, is obtained by replication of $E_1(x)$ via the function $r(x)$ which may contain variations in raster spacing due to the vibrations. Thus, the total background exposure is given by, $$E(X) = E_1(X) * r(X) \tag{16}$$

The Fourier transform of $E(x)$ will reveal any modulation in the exposure due to the vibrations. Thus, $$\overline{E}(f) = \overline{E}_1(f) \cdot \overline{r}(f) \tag{17}$$

Clearly, there will be modulation in the exposure at the nominal raster frequency, but this modulation is held to a low value by use of a sufficiently larger laser spot, and the raster frequency is above the sensitive frequency range of the eye. On the other hand, modulation in the replication funcition due to vibrations may be a problem if the spatial frequency is near the peak of the eye sensitivity (around 1 cy/mm). A vibrational frequency ($f_s$) present in $\overline{r}(f)$ will be manifest in the exposure unless $\overline{E}_1(f)$ is zero at that frequency. From Equation (15) it is seen that this condition is equivalent to $$[\overline{I}(f_s) \cdot \overline{O}(Mf_s)] * [\overline{I}(f_s) \cdot \overline{O}(Mf_s)] * = 0 \tag{18}$$

If this condition is satisfied, the vibrational frequency will not appear in the exposure distribution. From Equation (13) it is seen that the required condition will be met if $$[T(-\lambda d_i f_s) \cdot \overline{O}(Mf_s)] * [T(-\lambda d_i f_s) \cdot \overline{O}(Mf_s)] * = 0 \tag{19}$$

It would appear that Equation (19) is satisfied if either $T(-\lambda d_i f_s)$ or $\overline{O}(Mf_s)$ is zero. However, Equation (19) is a convolution, which will not vanish if $T(-\lambda d_i f_s)$ or $\overline{O}(Mf)$ is zero at only the vibrational frequency $f_s$. In fact, the vibrational modulation may be eliminated by use of a spatial filter in the exit pupil with the property $$T(X') = 0 \text{ at all } X' = \pm n(\lambda d_i f_s); \; n = 2,2, \tag{20}$$

However, with this filter many other (desired) spatial frequencies are attenuated also. A more practical filter function is given by $$T(X') = 1 - rect\left[\frac{X' - \lambda d_i f_s}{\lambda d_i f_s}\right] - rect\left[\frac{X' - \lambda d_i f_s}{\lambda d_i f_s}\right] \tag{21}$$

which will reduce, but not eliminate the unwanted modulation at $f_s$.

The spatial filtering solution set forth here is more general than that proposed above which applied to an ROS system in which the filter was placed in the first Fourier plane of the post-polygon lens. According to the present variation, the filter is placed in any plane in the "exit pupil" of the slow scan optics and the spatial scale of the filter is appropriately chosen for the geometry of the optics used.

While the invention has been described with reference to the particular system disclosed, it is not confined to the details set forth, but is intended to cover such modifications or changes as may come within the scope of the following claims:

What is claimed is:

1. A laser printing system comprising means for generating a beam of high intensity light, a moving recording medium sensitive to said high intensity light, optical means comprising a pluality of optical elements interposed between said light generating means and said recording medium and including a cylindrical lens positioned in proximity to said recording media, for imaging said beam to a spot at the surface of said medium, modulating means located between said light generating means and a scanner device for modulating the light beam in accordance with the information content of electrical signals, means coupled to said modulating means for deflecting said modulated light beam to a predetermined position on said scanner, said scanner device comprising a multi-faceted polygon located in the path of said modulated beam between said beam generating means and said recording medium and having reflective facets for reflecting the beam incident thereon onto said medium, means for rotating said polygon such that the reflected light is scanned in successive traces in any direction across said medium, said system further including an amplitude transmittance spatial filter positioned in the first Fourier plane of said cylindrical lens.

2. The system of claim 1 wherein said filter has a plurality n of opaque bars aligned in a parallel direction to said y scan the filter satisfying the expression $T(x') = 0$ for $x' = \pm n(\lambda d_i f_r)$; $n = 1, 2, 3$ where $\lambda$ is the wavelength of the high intensity light, $d_i$ is the distance from the cylindrical lens pupil plane to the recording medium and $f_r$ is the spatial frequency or vibration of the recording medium.

3. The system of claim 1 wherein said filter has an amplitude transmittance $$T(X') = 1 - rect\left(\frac{X' - F\lambda f_s}{F\lambda f_s}\right) - rect\left(\frac{X' + F\lambda f_s}{F\lambda f_s}\right)$$

where $\lambda$ is the wavelength of light, F is the distance of said cylindrical lens to said recording medium, and $f_s$ is the vibrational spatial frequency.

4. In a laser printing system, means for generating a beam of high intensity light, a moving recording medium sensitive to said high intensity light, optical means comprising a plurality of optical elements interposed between said light generating means and said recording medium, modulating means located between said light generating means and a scanner device for modulating the light beam in accordance with the information content of electrical signals, means coupled to said modulating means for deflecting said modulated light beam to a predetermined position on said scanner, means for moving said scanner such that the deflected modulated light is projected therefrom exit pupil aperture and diffracts to form an image across said medium, and further including an amplitude transmittance filter positioned at the plane of said aperture and having an amplitude transmittance $$T(X') = 1 - rect\left[\frac{X' - \lambda d_i f_s}{\lambda d_i f_s}\right] - rect\left[\frac{X' - \lambda d_i f_s}{\lambda d_i f_s}\right]$$

where $\lambda$ is the wavelength of the high intensity light, $d_i$ is the distance from the pupil plane to the recording medium, and $f_s$ is the optical frequency of vibration of the recording medium during its movement.

* * * * *